Figure 1:
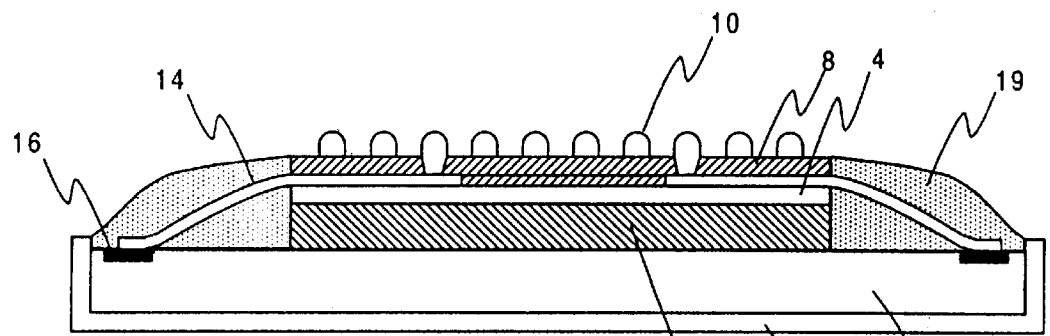

United States Patent [19]

Collander

[11] Patent Number: 5,872,700
[45] Date of Patent: Feb. 16, 1999

[54] MULTI-CHIP MODULE PACKAGE WITH INSULATING TAPE HAVING ELECTRICAL LEADS AND SOLDER BUMPS

[75] Inventor: Paul E. Collander, Grankulla, Finland

[73] Assignee: Nokia Mobile Phones Limited, Espoo, Finland

[21] Appl. No.: 888,906

[22] Filed: Jul. 7, 1997

[30] Foreign Application Priority Data

Jul. 11, 1996 [FI] Finland ................................. 962816

[51] Int. Cl.$^6$ ............................... H05K 1/11; H05K 1/14
[52] U.S. Cl. ..................... 361/760; 174/260; 257/723; 257/737; 257/778; 257/777; 361/776; 361/783; 361/790; 361/803
[58] Field of Search ...................... 174/253, 254, 174/260, 261, 268; 228/180.21, 180.22; 257/668, 684, 688, 690, 692, 693, 700, 701, 723, 737, 738, 735, 772, 773, 777, 778, 779, 780, 781; 361/760, 761, 762, 764, 772, 774, 776, 777, 783, 784, 789, 790, 803, 807, 809; 438/125, 126, 612, 613; 439/68, 69

[56] References Cited

U.S. PATENT DOCUMENTS

| | | | |
|---|---|---|---|
| 4,949,224 | 8/1990 | Yamamura et al. | 361/803 |
| 4,996,585 | 2/1991 | Gruber et al. | 357/74 |
| 5,148,265 | 9/1992 | Khandros et al. | 357/80 |
| 5,200,810 | 4/1993 | Wojnarowski et al. | 361/749 |
| 5,289,059 | 2/1994 | Pikkarainen | 307/520 |
| 5,347,159 | 9/1994 | Khandros et al. | 257/692 |
| 5,362,656 | 11/1994 | McMahon | 437/21 |
| 5,365,119 | 11/1994 | Kivari | 327/115 |
| 5,382,829 | 1/1995 | Inoue | 257/659 |
| 5,387,874 | 2/1995 | Rapeli | 327/337 |
| 5,390,223 | 2/1995 | Lindholm | 377/49 |
| 5,416,435 | 5/1995 | Jokinen et al. | 327/113 |
| 5,497,116 | 3/1996 | Rapeli | 327/337 |
| 5,528,083 | 6/1996 | Malladi et al. | 257/786 |
| 5,581,776 | 12/1996 | Hagqvist et al. | 395/590 |
| 5,663,106 | 9/1997 | Karavakis et al. | 438/126 |
| 5,753,974 | 5/1998 | Masukawa | 257/737 |

FOREIGN PATENT DOCUMENTS

| | | | |
|---|---|---|---|
| 0604005 | 6/1994 | European Pat. Off. | 257/778 |
| 0638931 A3 | 2/1995 | European Pat. Off. | |
| 5-6947 | 1/1993 | Japan | 257/723 |
| 5-82713 | 4/1993 | Japan | 257/723 |

*Primary Examiner*—Donald Sparks
*Attorney, Agent, or Firm*—Perman & Green, LLP

[57] ABSTRACT

The invention relates to microcircuit packaging techniques, and more particularly to the packaging of a structure compiled of several microcircuits. In an arrangement according to the invention, unpackaged components (2) are mounted on a substrate (20), and to the substrate (20) there is attached a tape (4); on the side of the tape directed away from the substrate, there are formed solder bumps (10). By the solder bumps (10), the whole structure can be mounted to a circuit board by applying conventional surface-mounting techniques. The connections between the solder bumps (10) and the I/O lines of the substrate are realised by conductive patterns formed on the tape, and by leads (14) provided at the edges of the tape. By employing the tape, it is possible to realise various different connections in a versatile manner, for instance connections between the substrate (20) and solder bumps (10), between components (2) and solder bumps (10), between components (2) and the substrate (20) as well as between single components (2).

15 Claims, 7 Drawing Sheets

MULTI-CHIP MODULE PACKAGE WITH INSULATING TAPE HAVING ELECTRICAL LEADS AND SOLDER BUMPS

The invention relates to the packaging technologies of microcircuits, and more particularly to the packaging of a combined structure of several microcircuits.

While electronic devices become smaller and smaller, the components must be packed more and more densely. Therefore a number of different package structures for microcircuits have been developed, the smallest among these being only slightly larger than the microcircuit chip. The component packing density and the small size of the microcircuit packages are, however, limited by the employed surface mounting techniques. The positioning accuracy of the devices generally used for installing discrete surface-mounted components is limited, and the smallest possible gap between separate solder junctions is relatively large. Therefore such package types where the pins of the microcircuit are located at the edges of the package are inevitably remarkably larger than a microcircuit encapsulated in said package. Another known solution, the BGA (Ball Grid Array) package utilises the whole bottom surface of the package for mounting external contacts. In this package, on the bottom surface of the package there are solder bumps at regular intervals, and these bumps are connected to the contact pads of the packaged microcircuit. Thus a large number of contacts can be mounted on a relatively small area, and the contact intervals can still be kept sufficiently wide for using conventional surface-mounting techniques. Typically -the solder bumps are made of lead-tin or gold-nickel and the contact to the circuit board is made by soldering or gluing.

A prior art microcircuit packaging technique known by the name $\mu$BGA is illustrated in FIG. 1. For the sake of illustrative clarity, the contact pads of single microcircuits are presented as black squares in all drawings of the present application. On the active side of the microcircuit chip 2, there is attached a tape 4, and on this tape, there are in turn attached the above described solder bumps 10 at relatively large intervals that are compatible with the applied surface mounting techniques. Because the bumps can be installed on the whole area of the tape 4, they need not be as densely assembled as the microcircuit contact pads located only at the edges of the microcircuit chip. The edge of the tape 4 is provided with leads 14 that are electrically connected to the bumps 10. The microcircuit contact pads 16 are coupled to the leads 14 of the tape 4 and thus to the bumps 10. Underneath the tape, there is provided a flexible layer 6 for adapting to the differences in the thermal expansion of the circuit board and the microcircuit, and above the tape there is arranged an insulating layer 8. The contact pads are further covered by protecting material 19, and the whole structure can be protected by a package 18. A package according to this type of structure is either of the same size or only slightly larger than the microcircuit chip itself, but owing to the relatively long intervals of the solder bumps, the component can still be installed by using conventional surface mounting techniques. This type of structure is presented for instance in the U.S. Pat. No. 5,148,265, Khandros et al.

Figure 2:
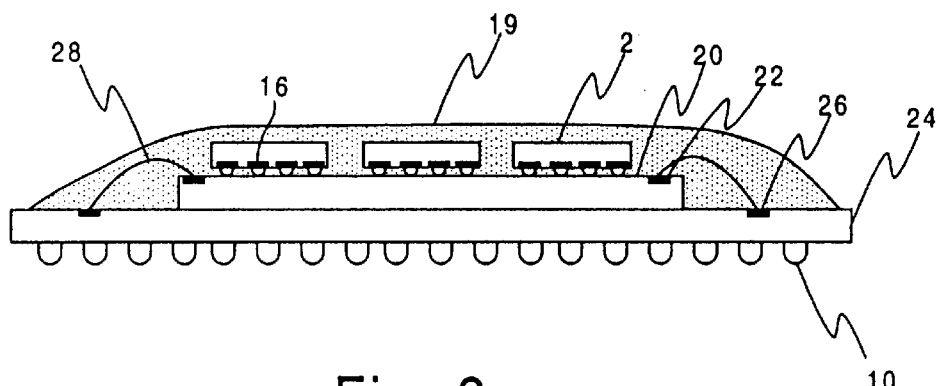

Another basic solution for minmising the mounting surface of components is to attach several unpackaged microcircuit chips on the same substrate, and then to encapsulate this multi-chip module. FIG. 2 illustrates the basic structure of one generally used application, a so-called MCM-Si technique (Multi-Chip Module on Silicon). Several unpackaged microcircuit chips are assembled on the same substrate 20, for instance by using the flip-chip technique. In the flip-chip technique, at the contact pads 16 of the microcircuit 2 there are built small metal bumps, and the microcircuit is assembled on the substrate so that the bump face is turned towards the substrate. On the substrate, there are formed conductive patterns which are then covered with solder material. By directing thermal energy to the substrate, at the site of the microcircuit, the solder material is melted, so that there is simultaneously created solder bonds between all bumps and conductive patterns of the substrate. On the silicon substrate, there can be assembled passive components, too, and in addition to the conductive patterns, there can also be formed both active and passive components on the silicon substrate by applying conventional microcircuit production techniques. In a structure like this, it is troublesome to create lead-throughs in the silicon substrate and solder bumps on the other side thereof for surface mounting, and therefore the substrate is generally assembled on a separate package substrate 24, with solder bumps 10 built thereon. The connections between the contact pads 22 of the substrate 20 and the contact pads 26 of the package substrate 26 are typically formed by means of wire bonds 28.

A drawback of the MCM-Si technique is that electric connections in between the components assembled on the substrate can only be created through the substrate 20, which makes the planning of the circuit more difficult and complicates the structure of the circuit. Moreover, although fairly high component packing densities can be achieved with this structure, the area is not utilised in the best possible fashion, because in order to create external connections, the package substrate 24 must be larger than the substrate 20. Likewise, the joining of the package substrate to the circuit substrate is difficult, there is needed both gluing and wire bonding. This and the need for a separate package substrate mean that the whole construction is expensive.

One prior art solution, which avoids the use of a separate substrate for packaging a multichip module, is described in the U.S. Pat. No. 4 996 585, Gruber et al. The Gruber patent describes a structure, in which pin plates are connected to a MCM substrate with flexible connector elements. The connector elements are connected between the edges of the substrate and the edges of the pin plates. The triangular pin plates are folded beneath the MCM substrate, so that in the folded position, the pins cover an area substantially similar to the area of the substrate. The pins are then used for connecting the MCM to other devices. This solution has the drawback, that the connector elements extend outside the substrate, thus wasting space.

The object of the present invention is to realise a package structure that is suited for packing a module compiled of several components and which requires a smaller area for installing than the prior art solutions. Another object of the invention is to realise a package structure that enables versatile circuit arrangements and various different ways of making contacts between the components. Yet another object of the invention is to realise a package structure with improved reliability and resistance to temperature changes.

These objects are achieved by combining the MCM-Si and BGA techniques by utilising a tape to which the BGA solder bumps are attached. In a first embodiment of the invention, the tape is assembled on the first side of the substrate, so that the components assembled on the substrate are left in between the tape and the substrate. In the tape, there are formed conductive patterns of some conductive material, and at the edge of the tape there are provided leads that are in contact with the solder bumps via said conductive patterns. The leads of the tape are connected to the contact pads of the substrate for instance by soldering or bonding.

The middle part of the tape can be provided with apertures, the edges whereof can also be provided with leads to make contacts to the contact pads located in the middle parts of the substrate. In similar fashion, contacts can also be made directly to the components assembled on the substrate, whereby the tape can be used for connections between contact pads of the components, or for instance for creating directly the coupling between a component and a bump. On the tape, there can easily be formed passive components, too, such as coils, capacitors and resistors.

In another embodiment of the invention, the tape is attached to the other side of the substrate, i.e. on the opposite side with regard to the components. The edges of the tape are folded over the edges of the substrate in order to bring the leads of the tape to the vicinity of the substrate contact pads in order to create contacts. The edges of the tape can be provided with tongues that can be used for making contact to the contact pads and components located in the interior of the substrate.

The system according to the invention is characterised in that said first side of the tape is directed towards the substrate and the second side comprising the solder bumps is directed away from the substrate; and that at least part of the leads of the tape are electrically coupled to the contact pads located on the substrate, and that said at least part of the leads are inside the edges of the substrate.

Figure 3:
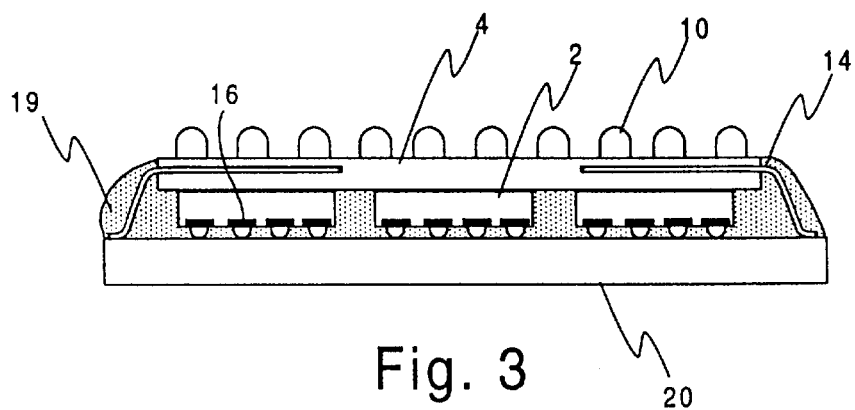
Figure 4:
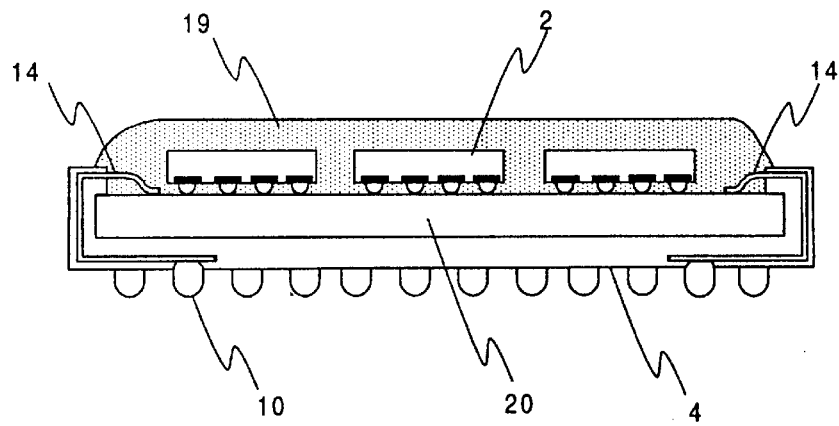
Figure 5:
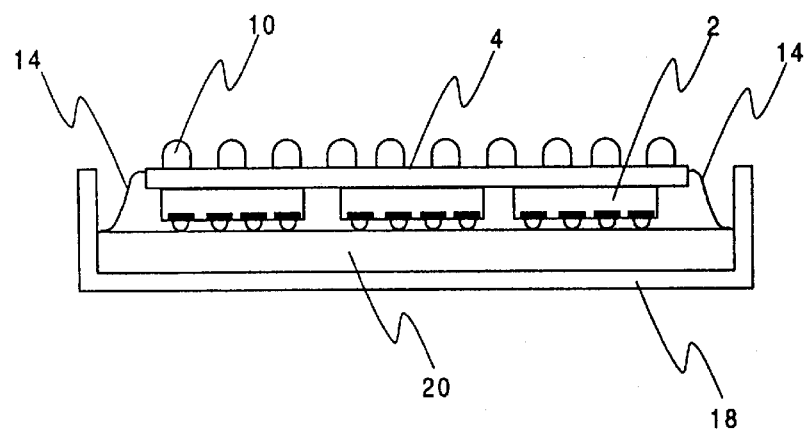
Figure 6:
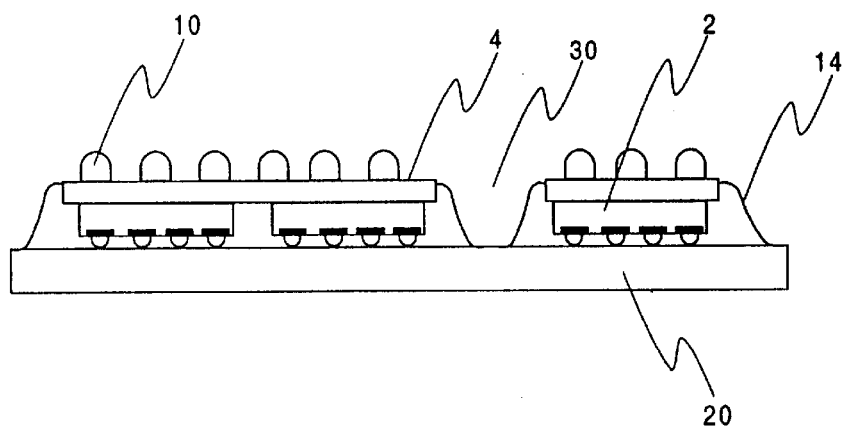
Figure 7:
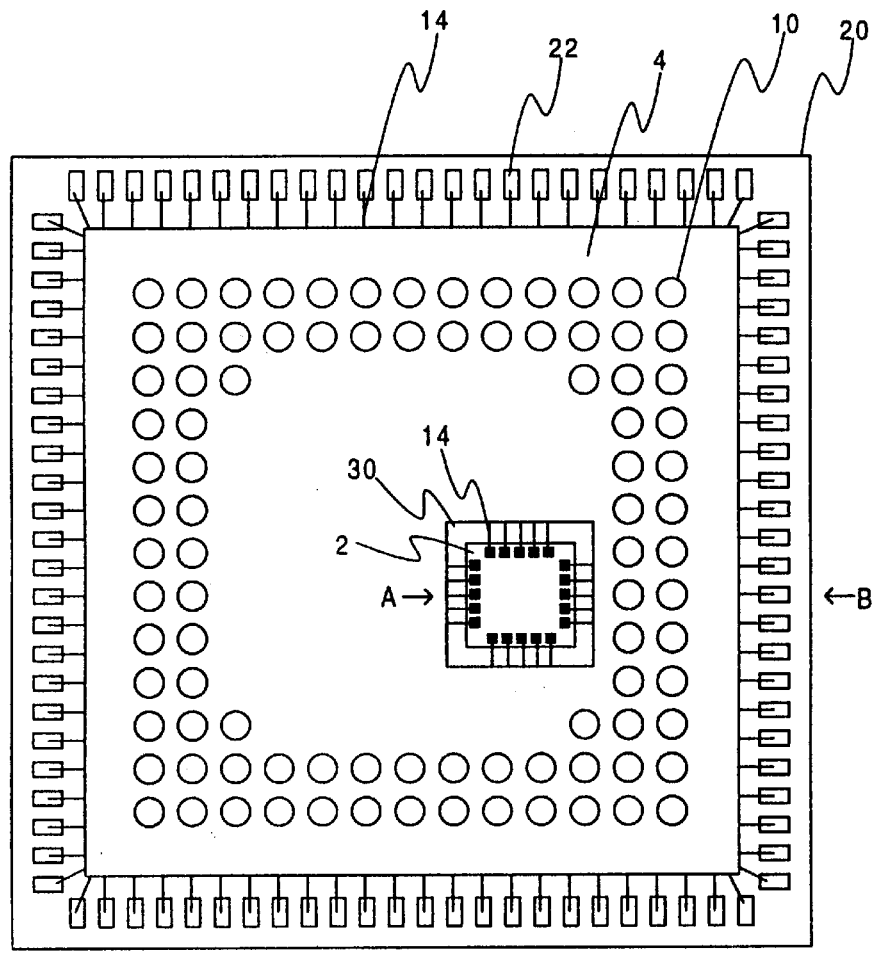
Figure 8:
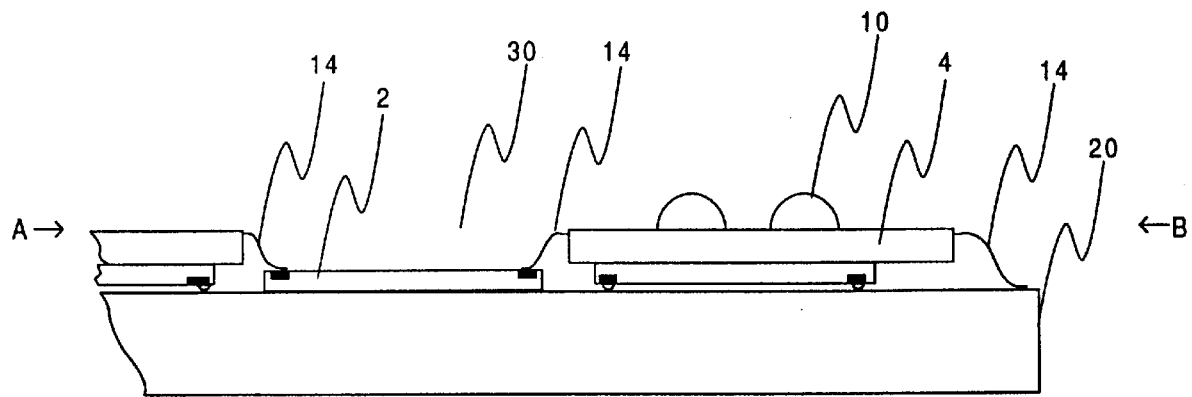
Figure 9:
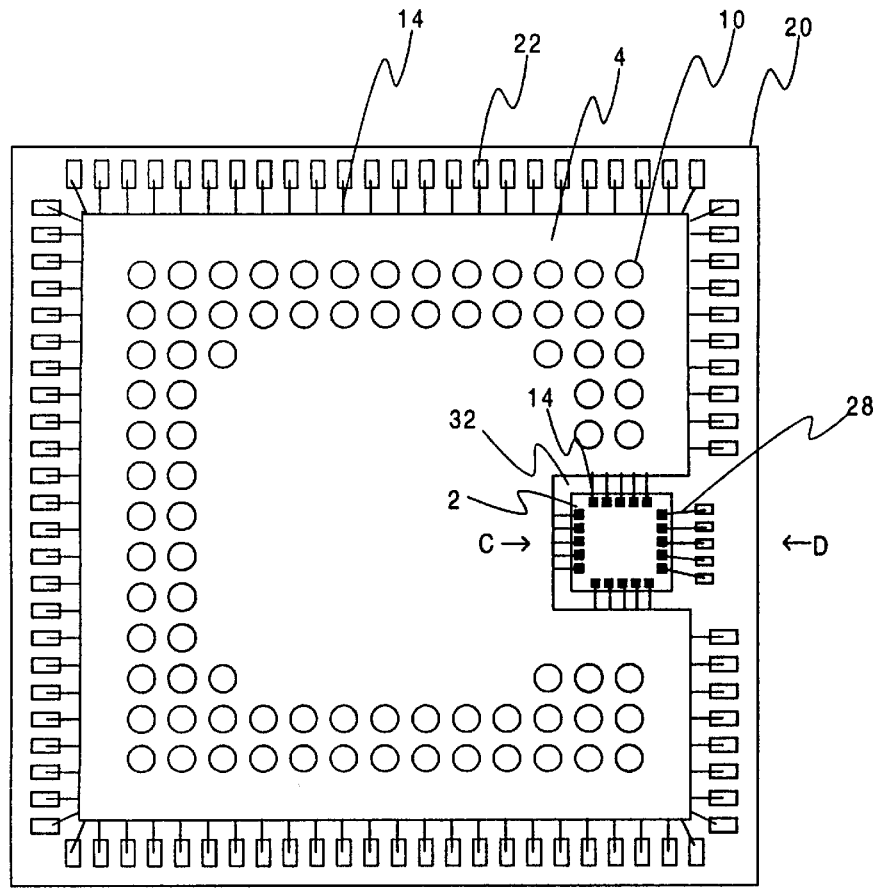
Figure 10:
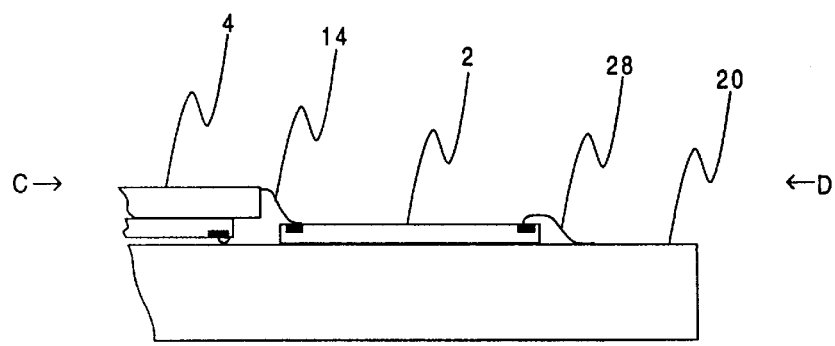
Figure 11:
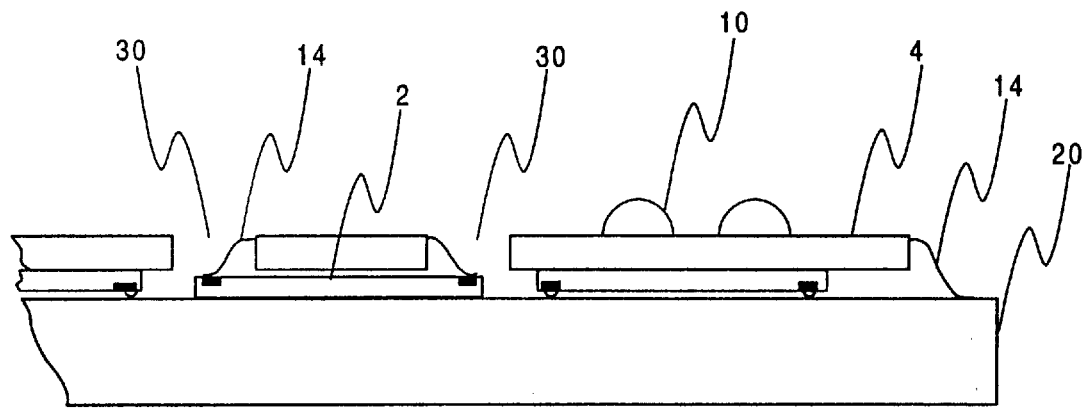
Figure 12:
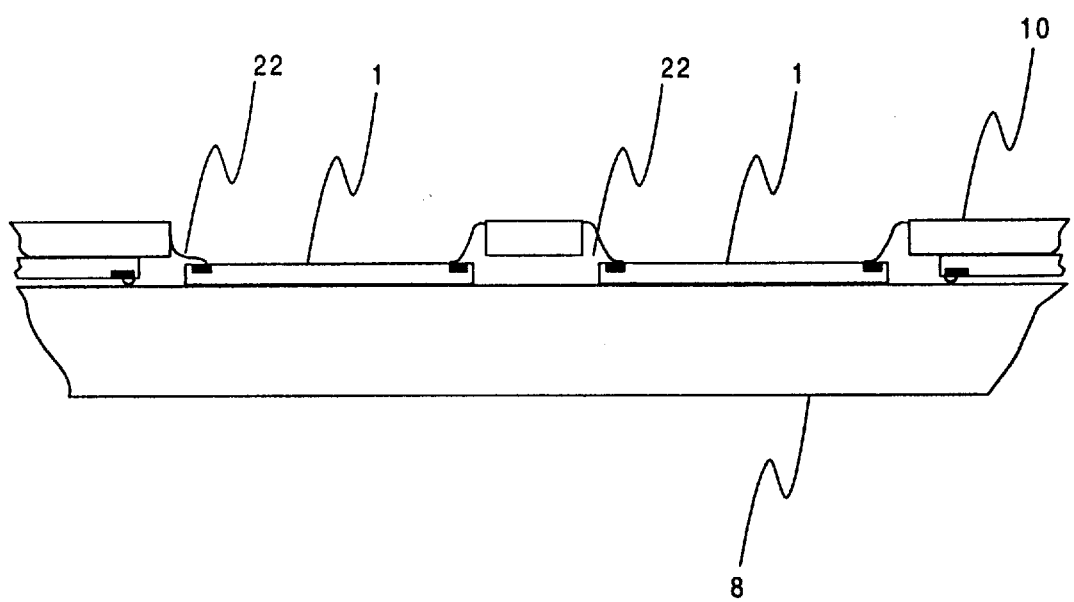
Figure 13:
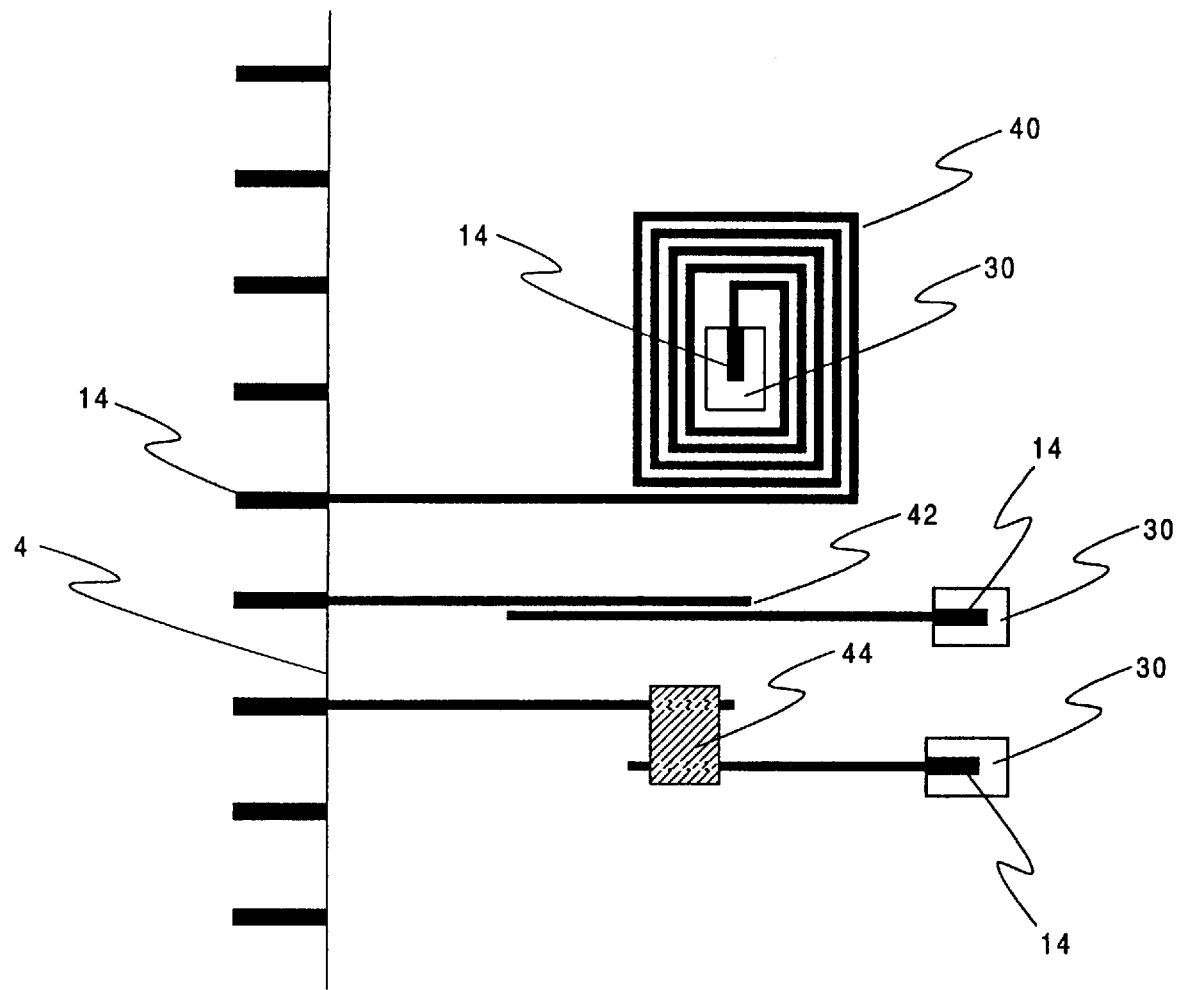
Figure 14:
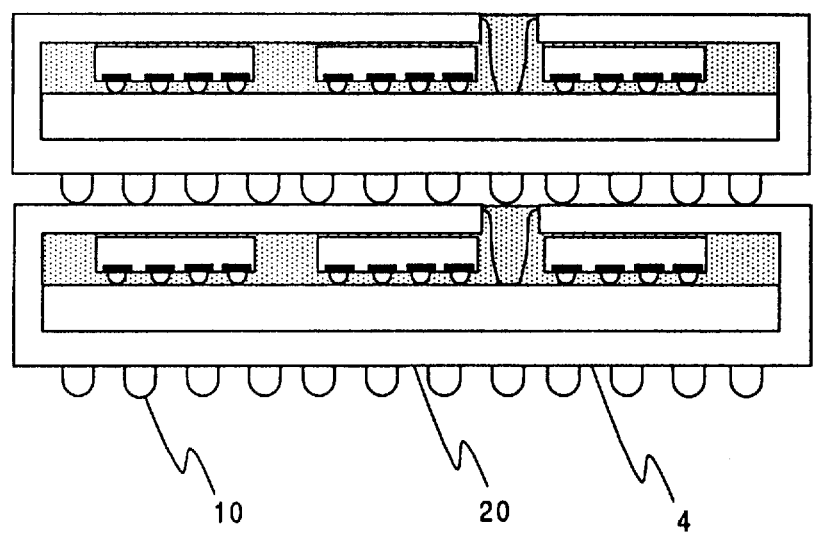

The invention is explained in more detail below, with reference to a few preferred embodiments described as examples, and to the appended drawings, where FIG. 1 illustrates a prior art μBGA packaging method with one microcircuit, FIG. 2 illustrates the structure of a prior art MCM-Si module formed of several microcircuits, FIG. 3 illustrates the first basic structure of a packaging method according to the present invention for a module formed of several microcircuits;

FIG. 4 illustrates another basic structure according to the invention,

FIG. 5 illustrates the basic structure according to the invention, provided with a protective coating, FIG. 6 illustrates an arrangement according to the invention, where the tape is provided with an aperture for making contacts to the interior of the substrate, FIG. 7 illustrates an arrangement according to the invention, where from the tape there can be made contact directly to a component located on the substrate, FIG. 8 is a cross-section of the structure illustrated in FIG. 7, FIG. 9 illustrates another arrangement where from the tape there can be made contact directly to a component located on the substrate, FIG. 10 is a cross-section of the structure illustrated in FIG. 9, FIG. 11 illustrates a preferred embodiment of the invention utilising apertures provided in the tape, FIG. 12 illustrates another preferred embodiment of the invention utilising apertures provided in the tape, FIG. 13 illustrates various possibilities for realising passive components in the tape, and FIG. 14 illustrates a preferred embodiment of the invention, according to which the package structures of the invention can be stacked on top of each other.

Like numbers for like parts are used in the drawings.

FIG. 3 illustrates the basic structure of the arrangement according to the invention in cross-section. There on the first side of the substrate 20, provided with components 2, there also is attached a tape 4, so that the components mounted on the substrate are left in between the substrate 20 and the tape 4. In the tape 4, there are formed solder bumps 10, whereby the whole structure can be mounted on the circuit board of some other system with conventional surface-mounting techniques. At the edges of the tape 4, there are formed leads 14, which are electrically coupled to the solder bump 10. The contact pads of the substrate 20 and the leads of the tape 4 are interconnected by some method known in the prior art, for instance by soldering or adhesion with a conductive glue. In this fashion, contacts can be made in between the circuits and solder bumps 10 formed on the substrate. According to a preferred embodiment of the invention, the tape 4 is smaller than the substrate 20, the leads 14 being completely inside the edges of the substrate, so that the area occupied by the packaged structure on the circuit board is not larger than the area of the substrate. Advantageously the solder bumps 10 are regularly spaced on the surface of the tape 4, thus utilising the whole area of the tape 4. In this fashion, a large number of bumps can be installed on the tape, so that the distances in between the bumps still remain large enough for the structure of the invention to be assembled on a circuit board by using conventional surface mounting techniques. Moreover, the structure can be partly or wholly covered with a protective material 19 in order to protect the components from foreign material and in order to improve mechanical durability and thermal conductivity.

FIG. 4 illustrates another basic solution according to the invention, where the tape 4 is located on an essentially different side of the substrate than the components 2. At least one edge of the tape 4, or a tongue provided at the edge thereof, is folded around the edge of the substrate 20 in order to bring the leads 14 of the tape 4 into the vicinity of the contact pads of the substrate 20 for connection. The same procedure can advantageously be followed with all four edges of a rectangular substrate and tape. In one embodiment of this basic approach, at least one edge of the tape 4, folded around the substrate edge, is provided with at least one tongue, whereby contacts to contact pads located in the middle area of the substrate can be made.

In a preferred embodiment of the invention, the tape 4 is made of some flexible material in order to conform to the differences in thermal expansion of the substrate 20 and the circuit board. The flexibility of the tape 4 also enables the creation of electric contacts when pressing measuring probes of a test equipment against the solder bumps. The flexibility of the structure prevents dam aging, of the substrate and of the components attached thereto, and at the same time ensures the formation of electric contact between the measuring probes and the solder bumps. Owing to a structure of this type, the component according to the invention can be attached to the testing equipment for checking, and detached therefrom without damaging the component. In another preferred embodiment of the invention the tape 4 is rigid, but the flexibility is realised with a separate flexible material layer installed in between the tape and the substrate. If this material layer is formed to be variable in thickness, the layer can also be used for levelling out any possible height differences between the different components.

FIG. 5 illustrates in cross-section a preferred embodiment of the invention, where the structure formed by the substrate and the tape is located in a package 18 in order to improve the mechanical durability of the structure. Moreover, the package 18 can be utilised for instance in cooling the structure by providing the package with cooling flanges. For the sake of clarity, the protecting material, which in FIGS. 1–4 is marked with number 19, is not illustrated in FIGS. 5–13.

FIG. 6 shows a cross-section of a third preferred embodiment of the invention, where the tape 4 is provided with at least one aperture 30 in order to make electroconductive contacts to—in addition to the contact pads located at the peripheral areas of the substrate—the contact pads located in the middle areas of the substrate, too. In one preferred embodiment of the invention, all electro-conductive contacts between the structure 4 and the contact pads of the substrate 20 are located in the aperture provided in the middle of the tape 4.

FIG. 7 introduces a fourth preferred embodiment of the invention, where the aperture 30 provided in the tape 4 is utilised for making contacts in between the tape 4 and the microcircuit 2 assembled on the substrate. FIG. 7 shows this embodiment as seen from the direction of the normal of the board 4, and FIG. 8 shows a cross-section along the line A-B. In this embodiment, the microcircuit 2 is not attached according to the flip-chip technique, but by disposing the active side of the microcircuit 2 towards the tape 4, so that the contact pads of the microcircuit and the leads 14 of the tape can be interconnected. In this embodiment, part of the microcircuit couplings can, when necessary, be realised with wire bonding, for instance if a short contact is required from the microcircuit to the conductive patterns of the substrate.

According to the preferred embodiment represented in FIG. 9, the tape 4 is provided with a notch 32 located at the edge of the tape, and likewise the aperture provided in the tape, this notch enables the making of electric contacts in between the tape 4 and the microcircuit. FIG. 10 shows this kind of structure in cross-section along the line C-D. As was already mentioned, the same microcircuit can provide contacts to both the leads of the tape 4 and by wire bondings to the substrate 20, which is illustrated by way of example in FIG. 10.

The tape 4 may also be provided with more than one aperture. The advantages of a structure of this type are illustrated in FIG. 11. The structural example represented in FIG. 11 is provided with two apertures 30, which are located at the contact pads of the microcircuit 2. Thus, by means of the tape 4, it is possible to simply form a short lead connection from one contact pad of the same microcircuit to another. FIG. 12 illustrates a structural solution with more than one aperture. Apertures are provided at two adjacent microcircuits, but in between them, there is a uniform neck in the tape 4. Via this neck, a short lead connection can be realised in a simple manner in between two adjacent microcircuits. By following the same principle, a lead connection between any two components can be realised in an arrangement according to the invention.

In a preferred embodiment of the invention, in the tape 4 there are realised inductive, capacitive or resistive members by means of conductive patterns. Some possible embodiments of these structures are illustrated in FIG. 13, where by utilising conductive patterns provided in the tape, there are realised an inductive member 40, a capacitive member 42 and a resistive member 44. In this embodi-ment the resistive member 44 is realised in the region 44 provided in between two leads and made of a material that is less conductive than said leads.

The above described embodiments, where contacts are made directly to the components assembled on the substrate by means of leads provided at the edges of apertures or notches formed in the tape, can also be applied to the inverted structure illustrated in FIG. 4, where the tape is located essentially on the opposite side of the substrate. The edges of the tape can be formed so that they, when folded around the substrate edges, extend to the middle areas of the substrate, in which case all arrangements described above can also be utilised in a structure like this.

The inverted structure of FIG. 4 can also be utilised for stacking the package structures of the invention according to a method illustrated in FIG. 14. The edges of the tape 4 can be designed so that they, when folded around the edges of the substrate 20, essentially cover the component side of the substrate, too, so that the tape essentially covers both sides of the substrate. The same result is obtained by using a modification of the basic structure illustrated in FIG. 3, where the edges of the tape attached on the component side of the substrate are folded to the other side of the substrate. In both cases, both sides of the whole package structure can be utilised for creating connections between the package and other devices. By means of an application of this type, it is possible to realise stacks of MCM-Si modules and thus achieve extremely high component densities.

It is obvious for a man skilled in the art that in an arrangement according to the invention, the tape 4 can be provided with several apertures 30, and that the form and location of the apertures can likewise vary depending on each application.

It is also obvious for a man skilled in the art that in a structure according to the invention, the components 2 to be mounted on the substrate 20 can be any components used in electronic assemblies, although the structure according to the invention is particularly well suited to microcircuit packages.

In addition to this, it is apparent for a man skilled in the art that in the arrangement according to the invention, various different bonding methods can be applied in the same structure, for instance soldering, gluing or bonding the leads located at the edges of the apertures 30 provided in the flexible tape 4, and on the other hand wire bonding for making contacts in between the components located on the substrate 20 and the contact pads of the substrate.

Likewise, it is apparent that the substrate 20 can be an active prior art substrate, on which there are realised, by conventional microcircuit production techniques, also active components such as transistors, in addition to lead contacts and passive components.

By employing the arrangement according to the invention, the installation area required by the module can be remarkably reduced, even tens of percentages as compared to the prior art technology. Moreover, the examples described above show that by means of the arrangement according to the invention, it is simple to realise several different types of lead connections, such as:

between the different regions of the substrate,
between different components,
between the contact pads of a single component,
between components and the substrate,
between components and solder bumps, and
between the substrate and solder bumps.

One advantage of the arrangement according to the invention is that a large-size package substrate is not needed anymore. In addition, the solution of the invention improves reliability, because the flexible tape conforms to the thermal expansion differences between even a large silicon substrate and a circuit board. By employing the arrangement of the invention, it is also possible to achieve a highly compact package, because the advantages brought about by the MCM-Si technology as for the module size, weight and electric operation are not deteriorated by any drawbacks caused by the large size of a cumbersome package substrate.

In the structure according to the invention, part of the module components, such as inductances and capacitances, can be shifted onto a flexible tape 4 and thus, as more structural alternatives emerge, it is possible to relief the design of the module.

I claim:

1. A package structure comprising a substrate (20), incorporating a first and a second side, said first side being an active side on which there are formed electroconductive connections and contact pads (22), and on which first side there are assembled at least two components (2), which package structure also comprises a tape (4), which is formed of an insulating material, having a first and a second side, on the second side of the tape there are provided solder bumps (10) in order to mount the package structure on a circuit board of some other system, on either side whereof there are formed patterns and leads (14) of some conductive material in order to create electric connections, and at least part of said leads (14) and part of said solder bumps (10) are in electric contact through said patterns formed of some conductive material, and which package structure is characterized in that said first side of the tape (4) is directed towards the substrate (20) and the second side of the tape comprising the solder bumps (10) is directed away from the substrate (20);

and that at least part of the leads (14) of the tape (4) are electrically coupled to the contact pads (22) located on the substrate, and that said at least part of the leads are inside the edges of the substrate.

2. A package structure according to claim 1, characterised in that by using patterns made of some conductive material, a connection is made between at least two leads (14) of the tape.

3. A package structure according to claim 1, characterised in that at least part of the leads (14) of the tape are folded towards at least one component (2) mounted on the substrate, and electrically connected to a contact pad (16) located on the component.

4. A package structure according to claim 1, characterised in that said tape (4) is provided with at least one aperture (30) for creating electroconductive connections between leads (14) formed in an interior of the tape and the contact pads (22) provided in an interior of the substrate, or contact pads (16) of the components (2) mounted on the substrate.

5. A package structure according to claim 1, characterised in that by means of the leads (14) of the tape and the patterns of conductive material, there is realised at least one conductive connection between two contact pads (22) of the substrate.

6. A package structure according to claim 1, characterised in that by means of the leads (14) of the tape and the patterns of conductive material, there is realised at least one conductive connection between two contact pads (16) of one of the components (2) mounted on the substrate (20).

7. A package structure according to claim 1, characterised in that by means of leads (14) of the tape and the patterns of conductive material, there is realised at least one conductive connection between contact pads (16) of the components (2) mounted on the substrate (20).

8. A package structure according to claim 1, characterised in that by means of the leads (14) of the tape and the patterns of conductive material, there is realised at least one conductive connection between a contact pad (16) of one of the components mounted on the substrate (20) and a contact pad (22) of the substrate.

9. A package structure according to claim 1, characterised in that the tape (4) is made of some flexible material in order to make the structure conform to the differences in the thermal expansion characteristics of a circuit board for assembly of the structure and the substrate (20) of the structure.

10. A package structure according to claim 1, characterised in that the tape (4) is provided with a layer of some flexible material in order to make the structure conform to the differences in the thermal expansion characteristics of a target of assembly of the structure and the substrate (20) of the structure.

11. A package structure according to claim 1, characterised in that in between the tape (4) and the substrate (20), there is provided a separate, flexible layer (6) of material in order to make the structure conform to the differences in the thermal expansion characteristics of a circuit board for assembly of the structure and the substrate (20) of the structure.

12. A package structure according to claim 1, characterised in that the leads (14) of the tape are arranged to be flexible in order to make the structure conform to the differences in the thermal expansion characteristics of a target of assembly of the structure and the substrate (20) of the structure.

13. A package structure according to claim 1, characterised in that at least one of the components (2) mounted on the substrate (20) is an unpackaged microcircuit (2).

14. A package structure according to claim 13, characterised in that at least one of the components (2) is attached to the substrate with the first side of the at least one component, comprising the contact pads (16), towards said tape (4), in order to enable an electroconductive connection in between at least one contact pad of the at least one component and at least one lead (14) of said tape.

15. A package structure according to claim 1, characterised in that on said tape (4), there is formed, by means of electroconductive patterns, at least one of the following members: a resistive element (44), a capacitive element (42) or an inductive element (40).

* * * * *